(12) United States Patent
Suh et al.

(10) Patent No.: US 7,966,436 B2
(45) Date of Patent: Jun. 21, 2011

(54) DATA TRANSMITTER HAVING HIGH AND LOW SPEED TRANSMISSION UNITS

(75) Inventors: Bum-Soo Suh, Gyeonggi-do (KR); Jong-Keun Na, Chungcheongnam-do (KR); Sung-Oh Kim, Gyeonggi-do (KR)

(73) Assignee: Mtekvision Co., Ltd., Seoul (KR)

( * ) Notice: Subject to any disclaimer, the term of this patent is extended or adjusted under 35 U.S.C. 154(b) by 139 days.

(21) Appl. No.: 12/343,336

(22) Filed: Dec. 23, 2008

(65) Prior Publication Data

US 2009/0172224 A1 Jul. 2, 2009

(30) Foreign Application Priority Data

Dec. 28, 2007 (KR) ........................ 10-2007-0140721

(51) Int. Cl.
*G06F 13/42* (2006.01)

(52) U.S. Cl. ........................................ 710/106; 370/276

(58) Field of Classification Search .......... 710/105–106, 710/8; 370/276
See application file for complete search history.

(56) References Cited

U.S. PATENT DOCUMENTS

2006/0214902 A1* 9/2006 Tamura ......................... 345/100
2007/0089035 A1* 4/2007 Alexander et al. ............ 714/766
* cited by examiner

*Primary Examiner* — Clifford H Knoll
(74) *Attorney, Agent, or Firm* — Birch, Stewart, Kolasch & Birch, LLP

(57) ABSTRACT

A data transmitter includes: a packetization unit receiving primary data from a data processor and packetizing the primary data; a high-speed transmission unit transmitting a data packet obtained from the packetization to a display device in a high-speed mode; and a low-speed transmission unit relaying and transmitting secondary data between the data processor and the display device in a low-speed mode. Accordingly, it is possible to transmit and receive data rapidly and efficiently.

11 Claims, 3 Drawing Sheets

DATA TRANSMITTER HAVING HIGH AND LOW SPEED TRANSMISSION UNITS

CROSS-REFERENCE TO RELATED APPLICATIONS

This application claims the benefit of Korean Patent Application No. 10-2007-0140721 filed with the Korean Intellectual Property Office on Dec. 28, 2007, the disclosures of which are incorporated herein by reference in their entirety.

BACKGROUND

1. Technical Field

The present invention relates to a data transmitter and a data receiver, and more particularly, to a data transmitter enabling a selective data transmission in two different modes between a data processor and a display device and a data receiver enabling a selective data reception in two different modes between the data processor and the display device.

2. Description of Related Art

The spread rate of portable communications apparatus such as mobile phones, PDA, small-sized notebook computers has been enhanced and specifications of portable electronic apparatuses have been raised in level.

Particularly, in display devices such as LCD and OLED, with the recent increase in expression of various graphics and the recent increase in requirement for displaying 3D graphics computing results, the definition of efficient interfaces was necessary for transmitting and receiving the great amount of data.

In recent years, the portable communication apparatuses tended to variously evolve in functions into combined portable communication apparatuses including various peripheral devices such as a camera module, a touch sensor, an MP3 audio as well as a display device.

Accordingly, the size of communication data between the peripheral devices and a host processor of the portable communication apparatus has been enhanced and there has been a need for an efficient data communication interface.

Since control data for controlling the display device as well as pixel data of a great size is repeatedly transmitted between the portable communication apparatus and the display device, it is necessary to efficiently manage the transmission of data.

SUMMARY

An advantage of some aspects of the invention is that it provides a data transmitter enabling rapid and efficient data transmission and reception between a peripheral display device and a host processor included in a portable communication apparatus.

Another advantage of some aspects of the invention is that it provides a data receiver enabling rapid and efficient data transmission and reception between a peripheral display device and a host processor included in a portable communication apparatus.

Other advantages of the invention will be apparently understood from the following detailed description.

According to an aspect of the invention, there is provided a data transmitter disposed between a data processor and a display device.

The data transmitter includes: a packetization unit receiving primary data from the data processor and packetizing the primary data; a high-speed transmission unit transmitting a data packet obtained from the packetization unit to the display device in a high-speed mode; and a low-speed transmission unit relaying and transmitting secondary data between the data processor and the display device in low-speed mode.

The primary data may include at least one of image data and setting data and the secondary data may include device data.

The data transmitter may further include an advanced peripheral bus (APB) controller and the packetization unit may receive the primary data from the data processor under the input control of the APB controller.

The data transmitter may further include an advanced peripheral bus (APB) controller and the low-speed transmission unit may receive the secondary data from the data processor and relay and transmit the received secondary data to the display device under the input control of the APB controller.

The high-speed transmitter may further include an ECC adding unit generating and adding an error correction code (ECC) on the data packet to the data packet; and a CRC information adding unit generating and adding a cyclic redundancy check (CRC) information on the data packet to the data packet.

The low-speed transmission unit may receive the secondary data in the low-speed mode from the display device and transmit the received secondary data to the high-speed transmission data. The high-speed transmission unit may check the ECC or the CRC information added to the secondary data and transmit the secondary data to the data processor.

The secondary data may include at least one of lower-power driving data, synchronization data, and reset data.

The packetization unit may packetize the primary data and add a data ID to the packetized primary data.

The data transmitter may further include a lane divider dividing the data packet transmitted by the high-speed transmission unit in the unit of bytes and supplying the divided data packets to a plurality of lanes. Here, the data transmitter may be electrically connected to the display device through the plurality of lanes.

According to another aspect of the invention, there is provided a data receiver disposed between a data processor and a display device.

The data receiver includes: a display processor; an error checking unit checking an error of a data packet or data to be processed by the display processor; a high-speed reception unit receiving the data packet from the data processor in a high-speed mode and transmitting the received data packet to the error checking unit; and a low-speed reception unit receiving secondary data from the data processor in a low-speed mode and transmitting the received secondary data to the error checking unit or directly transmitting the received secondary data to the display processor.

The error checking unit may determine the error by the use of an ECC or CRC information included in the data packet or data.

The display device may further include a backward relay unit transmitting backward data to the error checking unit and the backward data may be generated by the display processor.

The error checking unit may further include: an ECC adding unit adding the ECC to the backward data; and a CRC information adding unit adding the CRC information to the backward data.

The data receiver may be electrically connected to the external device through a plurality of lanes, and the data receiver may further include a lane combining unit receiving data, which is obtained by dividing the data packet in the unit of bytes, from the data processor through the plurality of lanes and recombining the data in the unit of bytes into the data packet.

According to the above-mentioned configurations, it is possible to reduce transmission errors of data by transmitting data for the display device in the high-speed mode or the low-speed mode depending on the data size.

It is also possible to reduce reception errors of data and to enhance a data processing efficiency of the display device, by receiving the data for the display device in the high-speed mode or the low-speed mode depending on the data size.

DESCRIPTION OF EXEMPLARY EMBODIMENTS

Figure 1:
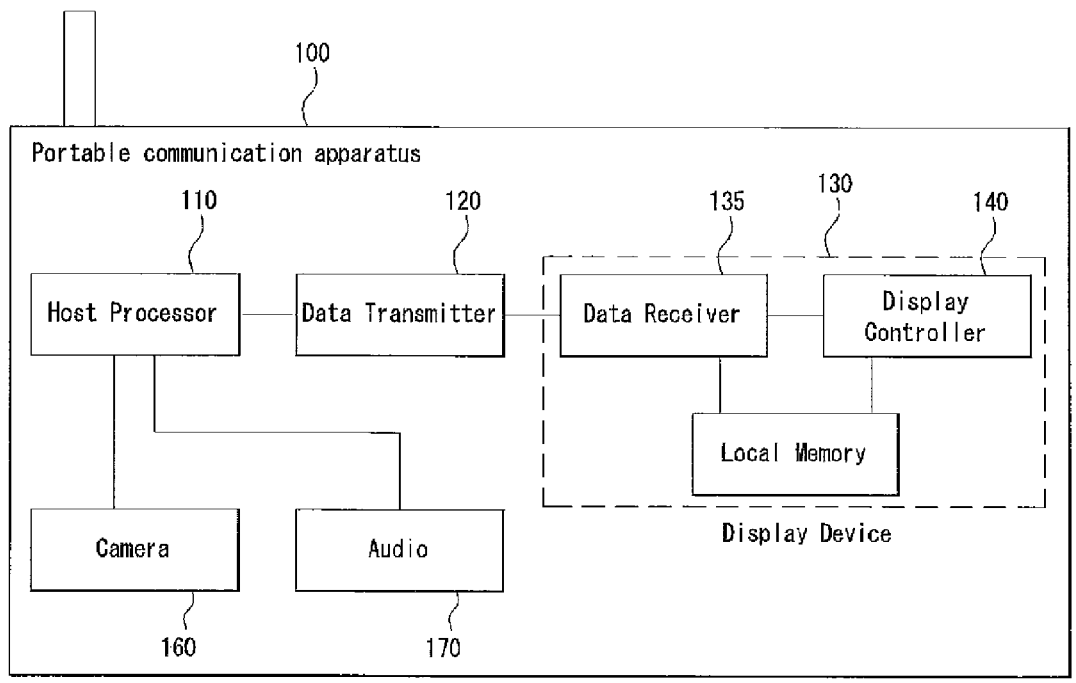
FIG. 1 is a diagram schematically illustrating a configuration of a portable communication apparatus employing a data transmitter and a data receiver according to an embodiment of the invention.

The invention can be variously modified in various embodiments and specific embodiments will be described and shown in the drawings. The invention is not limited to the embodiments, but it should be understood that the invention includes all the modifications, equivalents, and replacements belonging to the spirit and the technical scope of the invention. When it is determined that detailed description of known techniques associated with the invention makes the gist of the invention obscure, the detailed description will be omitted.

Terms, "first", "second", and the like, can be used to describe various elements, but the elements are not limited to the terms. The terms are used only to distinguish one element from another element. For example, without departing from the scope of the invention, a first element may be named a second element and the second element may be named the first element similarly. The term, "and/or", includes a combination of plural elements or any one of the plural elements.

If it is mentioned that an element is "connected to" or "coupled to" another element, it should be understood that the element may be connected or coupled directly to another element or that still another element may be interposed therebetween. On the contrary, if it is mentioned that an element is "connected directly to" or "coupled directly to" another element, it should be understood that still another element is not interposed therebetween.

The terms used in the following description are used to merely describe specific embodiment, but are not intended to limit the invention. An expression of the singular number includes an expression of the plural number, so long as it is clearly read differently. The terms such as "include", "have", and the like are intended to indicate that features, numbers, steps, operations, elements, components, or combinations thereof used in the following description exist and that the possibility of existence or addition of one or more different features, numbers, steps, operations, elements, components, or combinations thereof is not excluded.

So long as they are not defined differently, all the terms used therein, which include technical or scientific terms, have the same meanings as generally understood by those skilled in the art. It should be analyzed that the terms defined in dictionaries used in general have the same meaning as in the contexts of the related art, but the terms should not be analyzed ideally or excessively formal.

Hereinafter, exemplary embodiments of the invention will be described in detail with reference to the accompanying drawings.

FIG. 1 is a diagram schematically illustrating a configuration of a portable communication apparatus employing a data transmitter and a data receiver according to an embodiment of the invention.

Referring to FIG. 1, the portable communication apparatus 100 includes a host processor 110. The host processor 110 is a data processor controlling the overall operation of the portable communication apparatus 100. For example, when the portable communication apparatus 100 is a mobile communication terminal, the host processor 110 corresponds to a baseband processing unit.

The host processor 110 of the portable communication apparatus 100 is connected to plural peripheral devices 130, 160, and 170. The peripheral devices 130, 160, and 170 may be disposed in the portable communication apparatus 100 or may be connected to the portable communication apparatus 100 as independent devices outside the portable communication apparatus 100.

The host processor 10 transmits data to be physically outputted from the peripheral devices such as a display device 130, a camera 160, and an audio 170, which are electrically connected to the host processor 110, to the peripheral devices and transmits data for controlling operations of the peripheral devices 130, 160, and 170.

The data transmission between the host processor 110 and the display device 130 according to an embodiment of the invention will be described now. The portable communication apparatus 100 or the data transmitter 120 transmitting data from the portable communication apparatus 100 is an external device from viewpoint of the display device 130.

The host processor 110 processes various digital data and transmits the processed digital data to the peripheral devices 130, 160, and 170. Data transmitted to the display device 130 is divided into image data and device control data. The image data includes pixel data including information such as RGB pixel values of pixels constituting an image. The device control data includes data controlling an operation of the display device 130.

For example, when the host processor 110 is the mobile communication terminal 100 and downloads moving image data through wireless Internet, the host processor 110 can encode the moving image data so as to output an image from the display device. The encoded image data is transmitted to the display device and is received by a data receiver 135 included in the display device 130.

The received image data is temporarily stored in a frame buffer or a local memory 150 included in the display device 130.

The display device 130 can include an independent display controller 140. The display controller 140 transmits the image data temporarily stored in the frame buffer to a screen unit (not shown) of the display device, whereby an image is output.

For example, when a user of the mobile communication terminal 100 adjusts image brightness or image size by the use of a key pad of the mobile communication terminal 100, the device control data for controlling the image brightness or the image size of the display device 130 is generated by the host processor 110.

The generated device control data is transmitted to the display device 130 from the host processor 110 and is stored in the local memory 150 of the display device 130. The display controller 140 of the display device 130 executes control data or instructions stored in the local memory 150 to control the operation of the display device 130.

The image data and the device control data are examples of data generated and transmitted to the display device 130 by the host processor 110. The data can include synchronization information, reset information, and low-power driving information. The synchronization information is information to synchronize a frame image. The reset information is a command for resetting the display device when the synchronization fails or the display device erroneously operates. The lower-power driving information is a command for adjusting a color mode or the like of the display device.

The data transmitter 120 and the data receiver 135 according to the embodiment of the invention can enable the transmission of data in different modes between the host processor 110 and the display device 130. For example, the image data is transmitted in a high-speed mode and the device control data is transmitted in a low-speed mode. That is, the data to be transmitted and received between the data transmitter 120 and the data receiver 135 is divided into primary data and secondary data, the primary data is transmitted in the high-speed mode, and the secondary data is transmitted or received in the low-speed mode. The high-speed mode and the low-speed mode are relative concepts based on the transmission rate and the high speed and the lower speed are distinguished depending on values thereof. Accordingly, when data is transmitted in plural communication modes which are distinguished by speeds, the communication modes can be divided into the high-speed mode and the low-speed mode. In the low-speed mode, since the transmission frequency is lower than that of the high-speed mode and thus the power consumption is not great, it is possible to transmit data with power lower than that of the highs-speed mode. Accordingly, the low-speed mode can be understood with the same concept as a low-power mode.

For example, the image information such as pixel values can be transmitted as the primary data in the high-speed mode and the synchronization information and the reset information can be transmitted as the secondary data in the low-speed mode. However, the division of the primary data and the secondary data is not limited to this case, but data can be divided in advance into the primary data and the secondary data depending on natures and types of the data.

That is, data can be transmitted between the host processor 110 and the display device 130 in different modes depending on the natures and types of data.

In the past, the data transmitter transmitted the image data and the device control data in the same mode regardless of the natures and types of data, whereby the device control data having a small data size might be transmitted while the image having a large data size is being transmitted. Accordingly, a flickering phenomenon of an image occurred. However, the data transmitter 120 according to the embodiment of the invention can time-divisionally transmit data in different modes depending on the data, thereby outputting an image without interruption.

The high-speed mode is a unidirectional transmission mode and the low-speed mode is a bidirectional transmission mode. That is, the primary data is transmitted only forward in the high-speed mode, but the secondary data may be transmitted forward or backward data may be transmitted backward in the low-speed mode.

The forward direction means a direction in which data is transmitted from the host processor 110 to the display device 130. The backward direction means a direction in which data is transmitted from the display device 130 to the host processor 110.

Accordingly, the backward data means data to be transmitted from the display device 130 to the host processor 110. For example feedback data generated as the control result of the display controller 140 on the display device 130 can correspond to the backward data. That is, when the image data is synchronized by the use of the synchronization information transmitted from the host processor 110, the result data thereof can be generated, which corresponds to the feedback data and the backward data.

The difference in transmission between the high-speed mode and the low-speed mode can be determined depending on the frequency of a clock signal and a swing level, which will be described with reference to FIG. 2.

Figure 2:
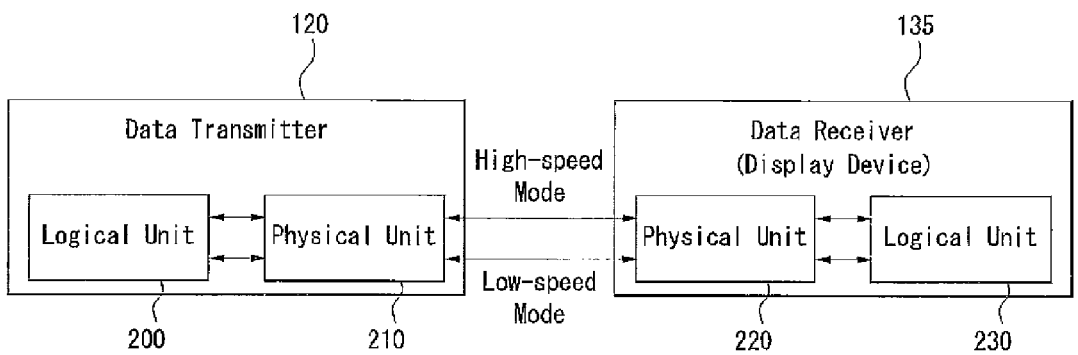
FIG. 2 is a diagram schematically illustrating the data transmitter and the data receiver according to the embodiment of the invention.

FIG. 2 is a diagram schematically illustrating the data transmitter and the data receiver according to the embodiment of the invention.

Referring to FIG. 2, the data transmitter 120 according to the embodiment of the invention includes a logical unit 200 and a physical unit 210. The logical unit 200 divides the data, which is received from the host processor by the data transmitter, into the primary data and the secondary data and determines whether the data should be transmitted in the high-speed mode or the low-speed mode. When it is determined as the primary data to be transmitted in the high-speed mode, the logical unit packetizes the data and transmits the packetized data, that is, a data packet. The logical unit performs a function of adding an error correction code (ECC) or a cyclic redundancy check (CRC) information for checking a transmission error to the data packet transmitted in the high-speed mode. This function will be described later with reference to FIG. 3A.

The physical unit 210 performs a function of converting the secondary data divided by the logical unit 200 or the primary data packetized into a data packet into analog signals and transmitting the analog signals to the display device. The data processed by the logical unit 200 is digital data and thus should be converted into analog signals for transmission to the display device 135. That is, the physical unit converts the digital data into the analog signals by the use of a clock signal. By making the frequency and the swing level of the clock signal different between the high-speed mode and the low-speed mode, the transmission rate of data is changed by data. The frequency and the swing level of the clock signal will be described in detail later.

The data transmitter 120 including the logical unit 200 and the physical unit 210 may be included in the portable communication apparatus 100 or may be an independent module that can be electrically connected to the portable communication apparatus 100.

The data transmitter 120 and the display device 130 should be electrically connected to each other for data communication using the physical unit 210. For example, they may be electrically connected through a PCB (printed circuit board), a flex-foil, or a cable. It is possible to input and output a high-speed and low-voltage signal and to transmit and receive a low-speed and low-power signal through the electrical connection (lanes).

The data output from the logical unit 200 is transmitted in accordance with the clock signal provided to the data transmitter 120 and the clock signal is different between the high-speed mode and the low-speed mode. That is, in the high-speed mode, the clock signal has a low swing level and swings, for example, at 200 mV. On the contrary, in the low-speed mode, the clock signal has a swing level of 1.2 V.

The frequency as well as the swing level is different between the high-speed mode and the low-speed mode. In the high-speed mode, the frequency of the clock signal is high and thus data can be transmitted at a high speed.

Since the physical unit 210 generates two kinds of clock signals depending on the high-speed mode and the low-speed mode to transmit data, the primary data and the secondary data transmitted from the logical unit 200 can be transmitted in different modes.

The data receiver 135 should include a physical unit 220 for receiving the analog signals transmitted from the data transmitter 120 and converting the received analog signals into digital data. However, unlike a general AD converter, two kinds of clock signals should be used to receive and convert the analog data transmitted in two kinds of modes into digital data, which is the same as described in the physical unit 210 of the data transmitter.

The data packet converted into digital signals by the physical unit 220 of the data receiver 135 is transmitted to the logical unit 230 of the data receiver 135. The configuration of the logical unit 230 will be described later with reference to FIG. 3B.

The data transmitter 120 and the data receiver 135 according to the embodiment of the invention can transmit and receive data through plural lanes. In this case, a lane divider (not shown) is required for dividing and transmitting data through the plural lanes.

Accordingly, the data transmitter 120 according to the embodiment of the invention can include the lane divider and the lane divider may be disposed between the logical unit 200 and the physical unit 210. That is, the data packet to be transmitted in the high-speed mode by the logical unit may be transmitted through one data path, but the data packet may be divided in the unit of bytes and transmitted through the plural data lines.

When it is assumed that the number of lanes is 4, the data packet including data in the unit of bytes is sequentially assigned to lane 1 to lane 4. That is, the data in the unit of bytes of the data packet is putout from the high-speed transmission unit 340 in the order of Byte 0, Byte 1, Byte 2, and Byte 3, Byte 0 is assigned lane 1, Byte 1 is assigned to lane 2, Byte 2 is assigned to lane 3, and Byte 3 is assigned to lane 4.

Accordingly, the data receiver 135 may include a lane combining unit for receiving a data packet in the unit of bytes divided and transmitted. That is, the data is recombined into a packet by the lane combining unit combining data in the unit of bytes transmitted through different lanes.

The lane combining unit performs the reversed function of the lane divider. Since the data packet is divided into data in the unit of bytes in the order of lane numbers (lane 1, lane 2, lane 3, and lane 4), the original packet can be reconstructed by combining the data in the same order. The lane combining unit may be disposed between the physical unit 220 and the logical unit 230, similarly to the lane divider.

Figure 3A:
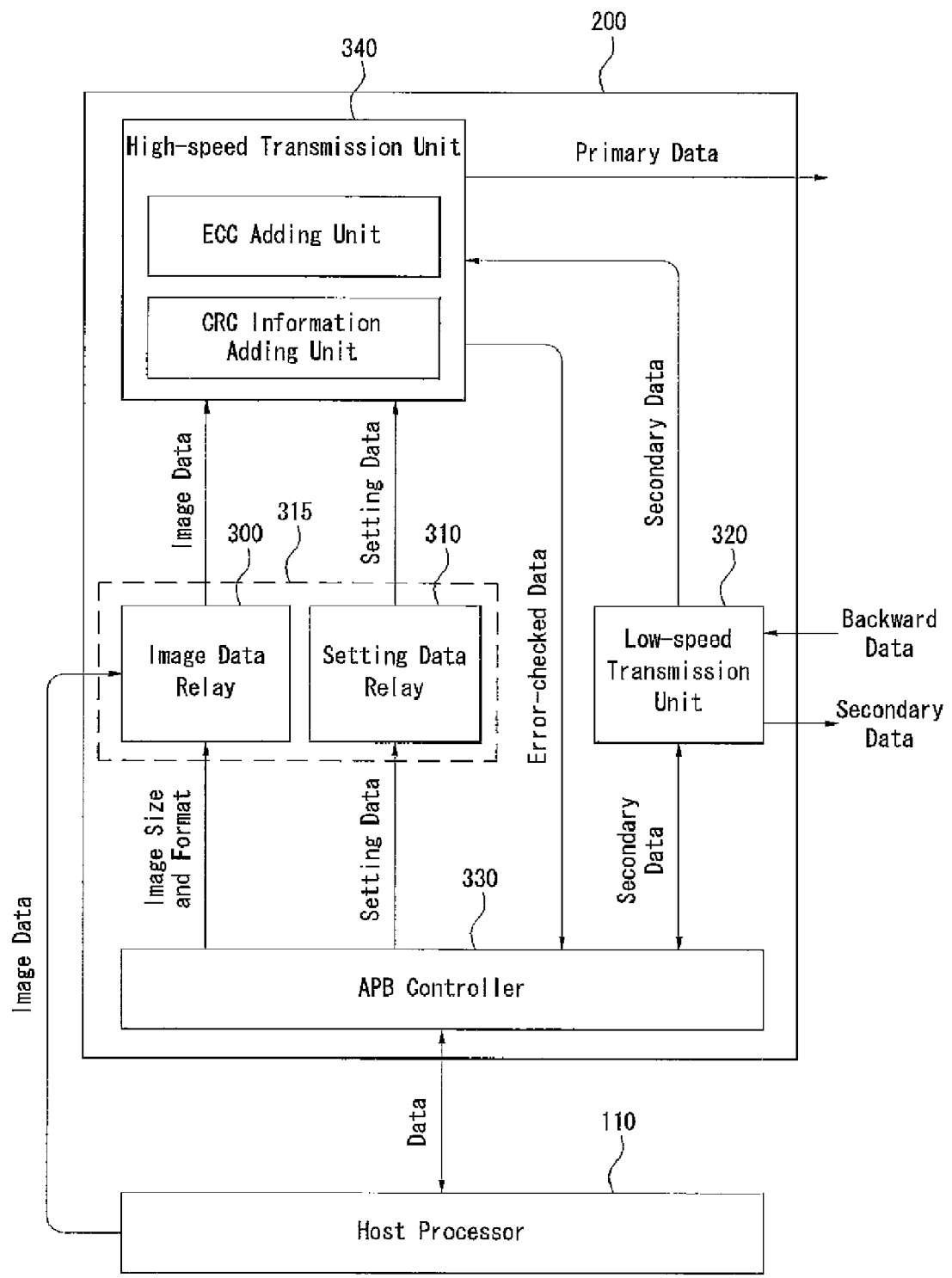
FIG. 3A is a block diagram illustrating a configuration of the data transmitter according to the embodiment of the invention.

FIG. 3A is a block diagram illustrating a configuration of the data transmitter according to the embodiment of the invention.

Referring to FIG. 3A, the data transmitter 120 includes a packet processing unit, a high-speed transmission unit, a low-speed transmission unit, and an advanced peripheral bus (APB) controller 330.

The packet processing unit of the data transmitter according to the embodiment of the invention includes an image data relay 300 and a setting data relay 310. The image data and the setting data are classified in the primary data described with reference to FIGS. 1 and 2 and are packetized and transmitted from the host processor to the high-speed transmission unit through the relays of the packet processing unit. However, the classification is only an example and different types of data such as low-power driving commands may be transmitted to the high-speed transmission unit in accordance with the control setting of the APB controller. In the followings, the image data and the setting data will be described mainly.

The host processor 110 of the portable communication apparatus generates the image data and the setting data for displaying the image data and transmits the generated data to the data transmitter 120. The image data and the setting data generated by the host processor 110 may be received by the host processor 110 through a network from the outside or may be generated by a program installed in a storage unit (not shown) connected to the host processor 110.

First, the image data includes information such as pixel values of an image and the image data relay 300 can receive the image data directly from the host processor. However, since the image data is a large-capacity data and should be transmitted in the form of packet, the image data relay 300 packetizes the image data received directly from the host processor 110. Information on the size and format of packet can be received from the APB controller 330 along with the image data or the setting data to be described later.

The image data relay 300 can receive pixel data as the image data from the host processor 110 and can receive data defining the size and format of an image from the APB controller 300. The APB controller 330 will be described later.

The first byte of the data packet transmitted from the display device 130 according to the embodiment of the invention includes a data identifier (ID). Accordingly, the image data relay 300 adds a data type and a data ID for identifying the image data to the head of the packet while packetizing the image data.

The image data relay 300 transmits the generated image data packets to the high-speed transmission unit 340. The high-speed transmission unit 340 generates the ECC and the CRC information and adds the generated ECC and CRC information to the head or tail of the image data packets.

The setting data relay 310 receives the setting data from the APB controller 330. The setting data is environmental information of the display device 130 required for outputting the image data as an image on the display device 130. For example, the setting data can include light and darkness, brightness, gamma correction index, horizontal and vertical positions of a picture, and resolution.

The setting data relay 310 packetizes the setting data and transmits the packetized setting data to the high-speed transmission unit 340. However, since the setting data is information required for outputting the image data packets transmitted from the image data relay 300 as an image on the display device, the same identifier as the identifier added to the image data packet is added to the header of the setting data packet. In this case, the image data relay 300 and the setting data relay 310 can be connected to transmit and receive data.

In case of the setting data, similarly to the image data packet, the high-speed transmission unit 340 generates the ECC and the CRC information, adds the ECC and the CRC information to the head or tail of the data packet, and then transmits the resultant data packet in the high-speed mode.

The low-speed transmission unit 320 receives the secondary data from the APB controller 330. The secondary data includes, for example, the synchronization information (sync. signal) or the reset information (reset trigger). Accordingly, the synchronization information or the reset information is not transmitted to the high-speed transmission unit 340, but is transmitted directly to the display device in the low-speed mode from the low-speed transmission unit 320.

Accordingly, the secondary data can be transmitted to the display device in a way different from the primary data.

The secondary data may include a power control command of the display device 130, for example, the low-power driving command such as commands for a screen saver function or a color mode change (shutdown peripheral command 44p., color mode off). However, the low-power driving command can be transmitted in the high-speed mode as described above, when it is transmitted to the packet processing unit for transmission in the high-speed mode, not in the low-speed mode, under the control of the APB controller 330.

The low-speed transmission unit 320 not only receives only the device data from the APB controller 330 and transmits the received device data to the display device (forward), but also receives the backward data from the display device 130 (backward). Accordingly, the low-speed transmission unit 320 performs a function of bi-directionally relaying data in the low-speed mode.

However, when the backward data is transmitted from the display device 130, an error code may be added and transmitted from the display device 130. Accordingly, feedback data may be transmitted to the high-speed transmission unit 340 to check the error. Specifically, the high-speed transmission unit 340 included in the data transmitter according to the embodiment of the invention generates the error code by the use of the same formula as an error code generating formula used in the display device 130. Accordingly, it is possible to check the error of the feedback data transmitted with the error code added thereto from the display device 130.

Therefore, when the backward data transmitted from the display device 130 to the low-speed transmission unit 320 is transmitted to the high-speed transmission unit 340, the high-speed transmission unit 340 checks the error of the backward data and transmits the backward data to the APB controller 330. The APB controller 330 transmits the backward data to the processor and the processor analyzes the backward data and generates correction command data corresponding to the backward data.

The high-speed transmission unit 340 transmits the data packet with the ECC and the CRC information added thereto to the display device 130 in the high-speed mode. Accordingly, the image data, the size and format of the image, and the setting information which are directly required for outputting an image on the display device are transmitted in the high-speed mode. The image data and the size and format of the image is relayed by the image data relay 300 and the setting data is relayed by the setting data relay 310, as described above.

Figure 3B:
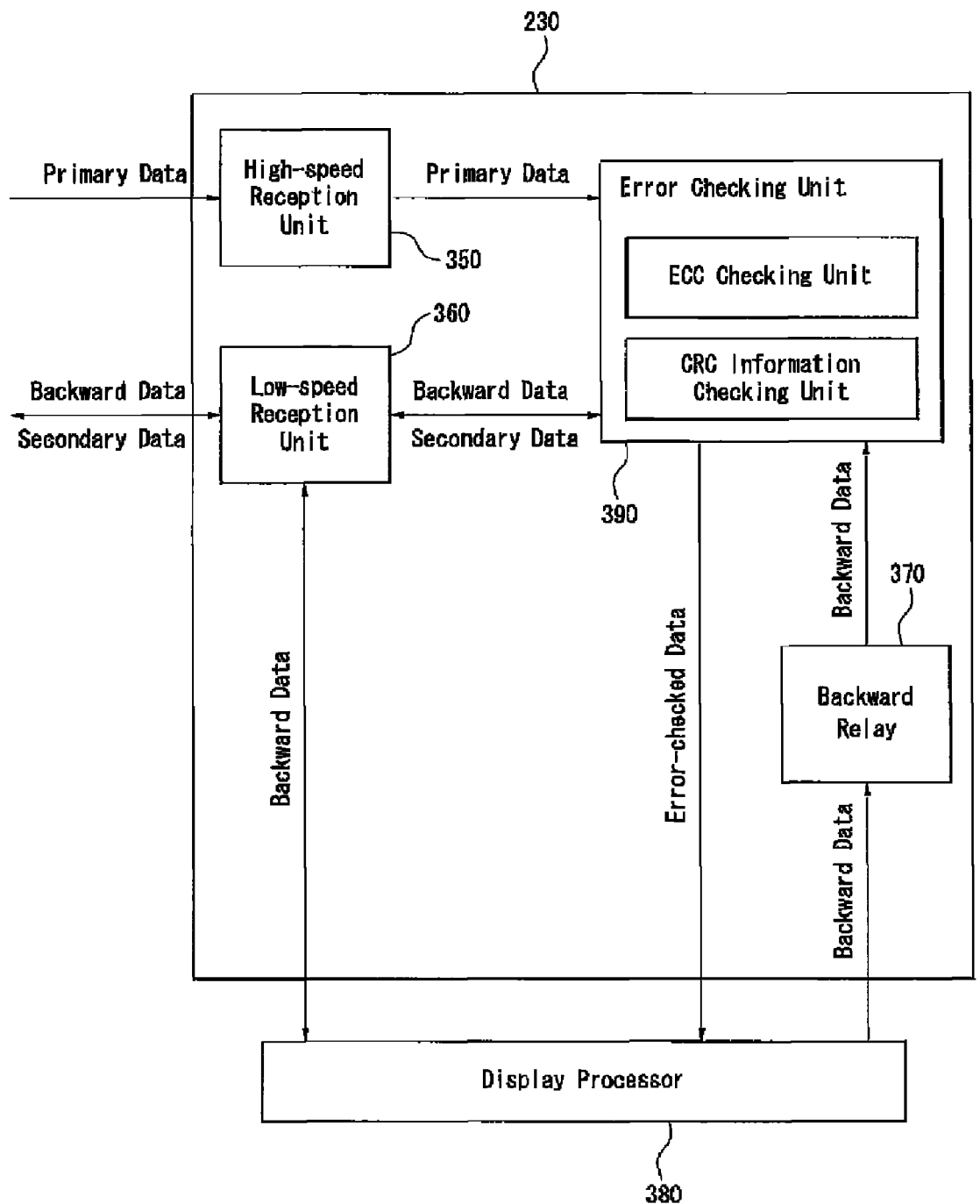
FIG. 3B is a diagram illustrating a configuration of the data receiver according to the embodiment of the invention.

FIG. 3B is a diagram illustrating a configuration of the data receiver according to the embodiment of the invention.

Referring to FIG. 3B, the data receiver according to the embodiment of the invention includes a high-speed reception unit 350, a low-speed reception unit 360, an error checking unit 390, and a backward relay 370.

The high-speed reception unit 350 transmits the packetized primary data, which is received in the high-speed mode from the data transmitter, to the error checking unit 390 by packet lengths. The error checking unit 390 will be described later.

The primary data received by the high-speed reception unit 350 corresponds to the data packet to which the ECC and the CRC information are added to and which is transmitted in the high-speed mode by the high-speed transmission unit. Accordingly, the data packet received by the high-speed reception unit 350 includes RGB data of pixels to be output as an image by the display device and may include other data such as the size and format of the image.

The backward data received by the low-speed reception unit 360 is the secondary data transmitted by the low-speed transmission unit of the data transmitter. Since the secondary data does not include the ECC and the CRC information and is transmitted in the low-speed mode by the low-speed transmission unit, the low-speed reception unit 360 can transmit the secondary data directly to the display processor 380. However, the data transmitter transmitting data to the data receiver is not limited to including the logical unit 200 shown in FIG. 3A. That is, when the data receiver 135 receives data from another external device (not shown), the secondary data may include the ECC. In this case, it should be determined whether the secondary data includes the ECC or the CRC information to be compatible with the external device.

Accordingly, it is determined whether the secondary data received by the low-speed reception unit 360 includes the ECC or the CRC information. When it is determined that the secondary data includes the ECC or the CRC information, the secondary data should be transmitted to the error checking unit 390 to check whether it is transmitted without any error. However, when the secondary data does not include the ECC or the CRC information, the error checking unit 390 need not determine the error and thus the secondary data is transmitted directly to the display processor 380.

The display processor 380 decodes the received secondary data and executes commands or the like included in the secondary data. For example, when the secondary data includes the low-power driving command such as a shutdown peripheral command and a color mode ON command, the display processor instructs to perform the driving with low power by inputting a control signal corresponding to the command to the corresponding module of the display device. When the secondary data includes the synchronization information or the reset information, the display processor controls to synchronize the images or to reset the display device.

It is obvious that the display processor 380 performs the functions of decoding, storing, and executing all the data packets received from the outside and thus description thereof will be omitted.

The error checking unit 390 checks the ECC and the CRC information included in the data packet or the data transmitted from the high-speed reception unit 350 or the low-speed reception unit 360 and determines whether an error occurs in the transmission. In case of the data packet, the error checking unit 390 can discover a 2-bit error in the packet header and correct a 1-bit error by the use of the ECC and determine whether any noise is included in the entire data packets by the use of the CRC information.

The backward relay 370 relays the backward data transmitted from the display processor 380 to the error checking unit 390. The backward data can include feedback information or information on the execution result of the display device having decoding and executing the primary data or the secondary data transmitted from the data transmitter to the data receiver. For example, when 720×480 pixel RGB data is transmitted from the host processor through the data transmitter, the display device can express only 120×90 pixels. In this case, the feedback information indicating that all the 720×480 pixels are not expressed should be transmitted to the host processor.

The backward relay 370 relays the backward data to the error checking unit 390 to add the ECC or the CRC information to the backward data. However, when the ECC or the CRC information is not added to the backward data and the backward data is transmitted backward, the display processor 380 transmits the backward data to the low-speed reception unit 360, not to the backward relay 370.

The error checking unit 390 may include an ECC adding unit and a CRC information adding unit. The ECC adding unit and the CRC information adding unit use the same generation formula as the error code generating formula used by the ECC adding unit and the CRC adding unit of the high-speed transmission unit 340 shown in FIG. 3A. Accordingly, the data transmitter receiving the backward data can check the transmission error of the backward data.

Although the invention has been described with reference to the exemplary embodiments, it will be understood by those skilled in the art that the invention can be modified and changed in various forms without departing from the spirit and scope of the invention described in the appended claims.

What is claimed is:

1. A data transmitter disposed between a data processor and a display device, the data transmitter comprising:
   a packetization unit configured to receive primary data from the data processor and packetize the primary data, the packetization unit including an image data relay and a setting data relay, wherein the primary data includes at least one of image data and setting data, and the image data relay is configured to packetize the image data and the setting data relay is configured to packetize the setting data;
   a high-speed transmission unit configured to transmit a data packet obtained from the packetization unit to the display device in a high-speed mode; and
   a low-speed transmission unit configured to relay and transmit secondary data between the data processor and the display device in a low-speed mode, and receive backward data from the display device in the low-speed mode, wherein the secondary data includes device data and the backward data includes feedback data.

2. The data transmitter according to claim 1, further comprising an advanced peripheral bus (APB) controller,
   wherein the packetization unit receives the primary data from the data processor under the input control of the APB controller.

3. The data transmitter according to claim 1, further comprising an advanced peripheral bus (APB) controller,
   wherein the low-speed transmission unit receives the secondary data from the data processor and relays and transmits the received secondary data to the display device under the input control of the APB controller.

4. The data transmitter according to claim 1, wherein the high-speed transmitter further includes:
   an ECC adding unit generating and adding an error correction code (ECC) on the data packet to the data packet; and
   a CRC information adding unit generating and adding a cyclic redundancy check (CRC) information on the data packet to the data packet.

5. The data transmitter according to claim 1, wherein the low-speed transmission unit receives the secondary data in the low-speed mode from the display device and transmits the received secondary data to the high-speed transmission unit, and
   wherein the high-speed transmission unit checks the ECC or the CRC information added to the secondary data and transmits the secondary data to the data processor.

6. The data transmitter according to claim 1, wherein the secondary data includes at least one of lower-power driving data, synchronization data, and reset data.

7. The data transmitter according to claim 1, wherein the packetization unit packetizes the primary data and adds a data ID to the packetized primary data.

8. The data transmitter according to claim 1, further comprising a lane divider dividing the data packet transmitted by the high-speed transmission unit in the unit of bytes and supplying the divided data packets to a plurality of lanes,
   wherein the data transmitter is electrically connected to the display device through the plurality of lanes.

9. The data transmitter according to claim 1, wherein the image data relay adds a data type and a data ID for identifying the image data to a header of a packet of the image data while packetizing the image data, and the setting data relay adds the same data ID to a header of a packet of the setting data while packetizing the setting data.

10. A communication apparatus, comprising:
    a data processor;
    a display device;
    a data transmitter disposed between the data processor and the display device, the data transmitter comprising:
        a packetization unit configured to receive primary data from the data processor and packetize the primary data, the packetization unit including an image data relay and a setting data relay, wherein the primary data includes at least one of image data and setting data, and the image data relay is configured to packetize the image data and the setting data relay is configured to packetize the setting data,
        a high-speed transmission unit configured to transmit a data packet obtained from the packetization unit to the display device in a high-speed mode, and
        a low-speed transmission unit configured to relay and transmit secondary data between the data processor and the display device in a low-speed mode, and receive backward data from the display device in the low-speed mode, wherein the secondary data includes device data and the backward data includes feedback data; and
    a data receiver disposed between the data processor and the display device, the data receiver comprising:
        a display processor,
        an error checking unit configured to check an error of a data packet or data to be processed by the display processor,
        a high-speed reception unit configured to receive the data packet from the data processor in a high-speed mode and transmit the received data packet to the error checking unit, and
        a low-speed reception unit configured to receive secondary data from the data processor in a low-speed mode and transmit the received secondary data to the error checking unit or directly transmit the received secondary data to the display processor.

11. The communication apparatus of claim 10, wherein the image data relay adds a data type and a data ID for identifying the image data to a header of a packet of the image data while packetizing the image data, and the setting data relay adds the same data ID to a header of a packet of the setting data while packetizing the setting data.

* * * * *